(12) United States Patent
Fujiya et al.

(10) Patent No.: US 7,365,977 B2
(45) Date of Patent: Apr. 29, 2008

(54) ELECTRONIC APPARATUS

(75) Inventors: Hiromitsu Fujiya, Kawasaki (JP); Hideki Kimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 35 days.

(21) Appl. No.: 11/387,768

(22) Filed: Mar. 24, 2006

(65) Prior Publication Data
US 2007/0223191 A1 Sep. 27, 2007

(51) Int. Cl.
*H05K 7/20* (2006.01)

(52) U.S. Cl. ............ 361/695; 361/690; 361/693; 361/724; 361/727; 454/184

(58) Field of Classification Search ........ 361/687, 361/690–696, 721–727; 174/16.1, 16.3, 174/15.1, 252; 165/80.2, 80.3, 122–126, 165/104.33; 454/184; 312/223.2, 223.3, 312/236
See application file for complete search history.

(56) References Cited

U.S. PATENT DOCUMENTS

| | | | |
|---|---|---|---|
| 4,797,783 A * | 1/1989 | Kohmoto et al. | 361/695 |
| 6,024,165 A * | 2/2000 | Melane et al. | 165/104.33 |
| 6,151,210 A * | 11/2000 | Cercioglu et al. | 361/690 |
| 6,463,997 B1 * | 10/2002 | Nicolai et al. | 165/80.2 |
| 6,525,937 B2 * | 2/2003 | Yanagida | 361/695 |
| 6,611,428 B1 * | 8/2003 | Wong | 361/695 |
| 6,628,520 B2 * | 9/2003 | Patel et al. | 361/696 |
| 6,987,673 B1 * | 1/2006 | French et al. | 361/727 |
| 7,046,513 B2 * | 5/2006 | Nishiyama et al. | 361/695 |
| 7,061,759 B2 * | 6/2006 | Karppinen et al. | 361/695 |
| 7,182,208 B2 * | 2/2007 | Tachibana | 211/26 |
| 7,184,267 B2 * | 2/2007 | Patel | 361/692 |

FOREIGN PATENT DOCUMENTS

| DE | 4035213 A1 * | 11/1990 |
|---|---|---|
| JP | 02005268546 A * | 9/2005 |
| RU | 2163061 C2 * | 2/2001 |

\* cited by examiner

*Primary Examiner*—Michael Datskovskiy
(74) *Attorney, Agent, or Firm*—Kratz, Quintos & Hanson, LLP

(57) ABSTRACT

Air in the first section is allowed to run into a second section through first and second air vents in an electronic apparatus. This causes an increase in the amount of airflow in the first section. In particular, if the pressure loss is larger in the first section, airflow blocked in the first section is forced to run into the second section. A smooth airflow can be established in the first section. Moreover, if the pressure in the first section is set larger than the pressure in the second section, a smoother airflow is established from the first section to the second section. A further superior airflow can be established in the first section.

2 Claims, 6 Drawing Sheets

ELECTRONIC APPARATUS

BACKGROUND OF THE INVENTION

1. Field of the Invention

The present invention relates to an electronic apparatus such as a server computer.

2. Description of the Prior Art

A back panel stands upright in the enclosure of a server computer, for example. System board units and input/output units are respectively coupled to the front and back surfaces of the back panel through connectors, for example. A fan unit or units are incorporated in the enclosure for the purpose of cooling these units. The fan unit serves to generate airflow running in the vertical direction through first and second spaces defined along the front and back surfaces of the back panel, respectively.

Assume that a power source unit is mounted on the upper rack of the enclosure in the first space. The airflow generated by the fan unit collides against the bottom of the power source unit in the first space. On the contrary, the airflow is discharged out of the second space through an air outlet formed in the top of the enclosure, for example. The airflow in the first space thus suffers from a larger pressure loss. Since the pressure increases in the first space, the airflow is prevented from smoothly running in the first space. The system board units and the input/output units in the first space cannot sufficiently be cooled.

SUMMARY OF THE INVENTION

It is accordingly an object of the present invention to provide an electronic apparatus enabling a smooth airflow therein.

According to a first aspect of the present invention, there is provided an electronic apparatus comprising: an enclosure including a panel, the enclosure defining first and second sections therein; an outer panel attached to the outer surface of the panel, the outer panel and the panel in combination defining a third section therebetween; a first air vent formed in the panel at a position corresponding to the position of the first section, the first air vent connecting the first section to the third section; and a second air vent formed in the panel at a position corresponding to the position of the second section, the second air vent connecting the second section to the third section.

The electronic apparatus allows airflow in the first section to move into the second section through the first and second air vents. This results in an increase in the amount of airflow in the first section. In particular, a large pressure loss in the first section causes the blocked airflow in the first section to easily move into the second section. The airflow is allowed to smoothly run in the first section. In addition, if the pressure of the first section is set larger than the pressure of the second section, for example, the airflow in the first section smoothly runs toward the second section. The airflow runs more smoothly in the first section.

The electronic apparatus may further comprise a fan placed with in the enclosure, the fan generating airflow running at least in the first section. The generated airflow may run from the first air vent to the second air vent through the third section. Even though the pressure loss in the first section increases, the airflow is allowed to move into the second section. The airflow is in this manner promoted in the first section. The first section may be located in front of the second section. Alternatively, the first and second sections maybe located side by side in the horizontal direction.

According to a second aspect of the present invention, there is provided an electronic apparatus comprising: an enclosure including at least partly a panel defining first and second spaces, the first space having a first pressure, the second space extending in parallel with the first space and having a second pressure smaller than the first pressure; an outer panel or exterior panel attached to the enclosure, the outer panel and the panel of the enclosure in combination defining a third space therebetween; a first air vent formed in the panel of the enclosure, the first air vent connecting the third space to the first space; and a second air vent formed in the panel of the enclosure, the second air vent connecting the third space to the second space.

The first pressure of the first space is set larger than the second pressure of the second space in the electronic apparatus, so shat airflow smoothly moves from the first space into the second space. This results in an increase in the amount of airflow in the first space. The blocked airflow in the first space can easily move into the second space. The airflow is allowed to smoothly run in the first space in this manner.

According to a third aspect of the present invention, there is provided an electronic apparatus comprising: an enclosure; and an exterior panel opposed to the outer surface of the enclosure, the exterior panel utilized to define an air passage outside the enclosure, the air passage connecting the inner spaces of the enclosure.

The air passage is defined outside the enclosure with the assistance of the exterior panel in the electronic apparatus. The air passage connects the inner spaces of the enclosure to each other. If airflow is blocked in one of the inner spaces while airflow smoothly runs in the other inner space, the air passage serves to realize the movement of the blocked airflow toward the other inner space. This results in realization of a smooth airflow in both of the inner spaces of the enclosure.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
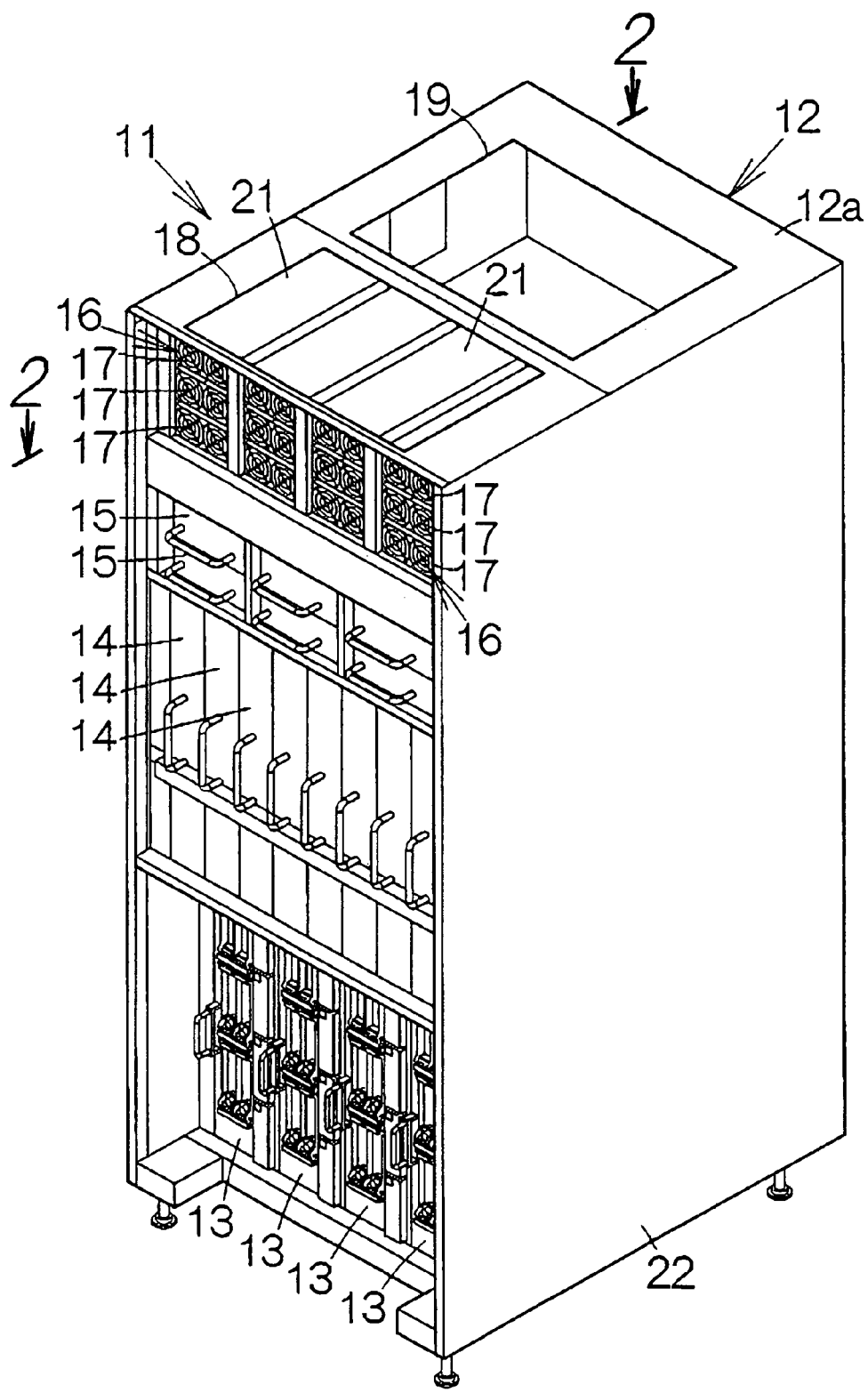
FIG. 1 is a perspective view schematically illustrating a server computer as a specific example of an electronic apparatus according to the present invention.

FIG. 1 schematically illustrates a server computer 11 as a specific example of an electronic apparatus according to the present invention. The server computer 11 includes an enclosure 12. Input/output units 13 are mounted on the lower rack of the enclosure 12. A PCI board is incorporated in the individual input/output unit 13. A LAN cable is coupled to the PCI board, for example. The PCI board stands upright in the vertical direction perpendicular to the floor.

System board units 14 are mounted on the middle rack of the enclosure 12. A system board is incorporated in the individual system board unit 14. Electronic circuit elements such as a central processing unit (CPU), a memory, and the like, are mounted on a printed wiring board of the system board, for example. The CPU executes various kinds of processing based on software programs and/or data temporarily stored in the memory, for example. The system board stands upright in the vertical direction.

Fan units 15 are mounted on the upper rack of the enclosure 12. The individual fan unit 15 includes axial flow fans, for example. A rotor is incorporated in the individual axial flow fan. The rotation of the rotor in the fan unit 15 generates airflow running in the enclosure 12. The rotation axis of the rotor is set to extend in the vertical direction. The airflow thus runs in the vertical direction from the bottom of the enclosure 12 toward the top of the enclosure 12, for example.

Power source unit sets 16 are mounted on the uppermost rack of the enclosure 12. The power source unit sets 16 are arranged in four lines in the horizontal direction parallel to the floor, for example. The individual power source unit set 16 includes power source units 17 stacked in three tiers in the vertical direction, for example. The power source units 17 individually extend in the horizontal direction from the front of the enclosure 12 toward the rear of the enclosure 12 as described later. The power source units 17 serve to transform the alternating current supplied from an outlet into the direct current.

The enclosure 12 includes a panel at the top of the enclosure 12, namely a top panel 12a, extending in the horizontal direction. A first air discharge opening 18 is formed in the top panel 12a. The first discharge opening 18 may extend widely along the front edge of the top panel 12a, for example. A second air discharge opening 19 is formed in the top panel 12a at the back of the first air discharge opening 18. The airflow generated by the fan units 15 is discharged outside through the first and second air discharge openings 18, 19 as described later in detail.

The individual power source unit 17 includes an enclosure, namely a duct 21, defining an inner space extending in the horizontal direction from the front of the enclosure 12 toward the rear of the enclosure 12. A fan is incorporated in the inner space of the duct 21. The fan serves to generate airflow running from the front end of the duct 21 toward the rear end of the duct 21. Here, the adjacent ones of the power source unit sets 16 are spaced from each other at a predetermined interval. Likewise, the outermost power source unit sets 16 are spaced from the sides of the enclosure 12 at predetermined intervals, respectively.

Figure 2:
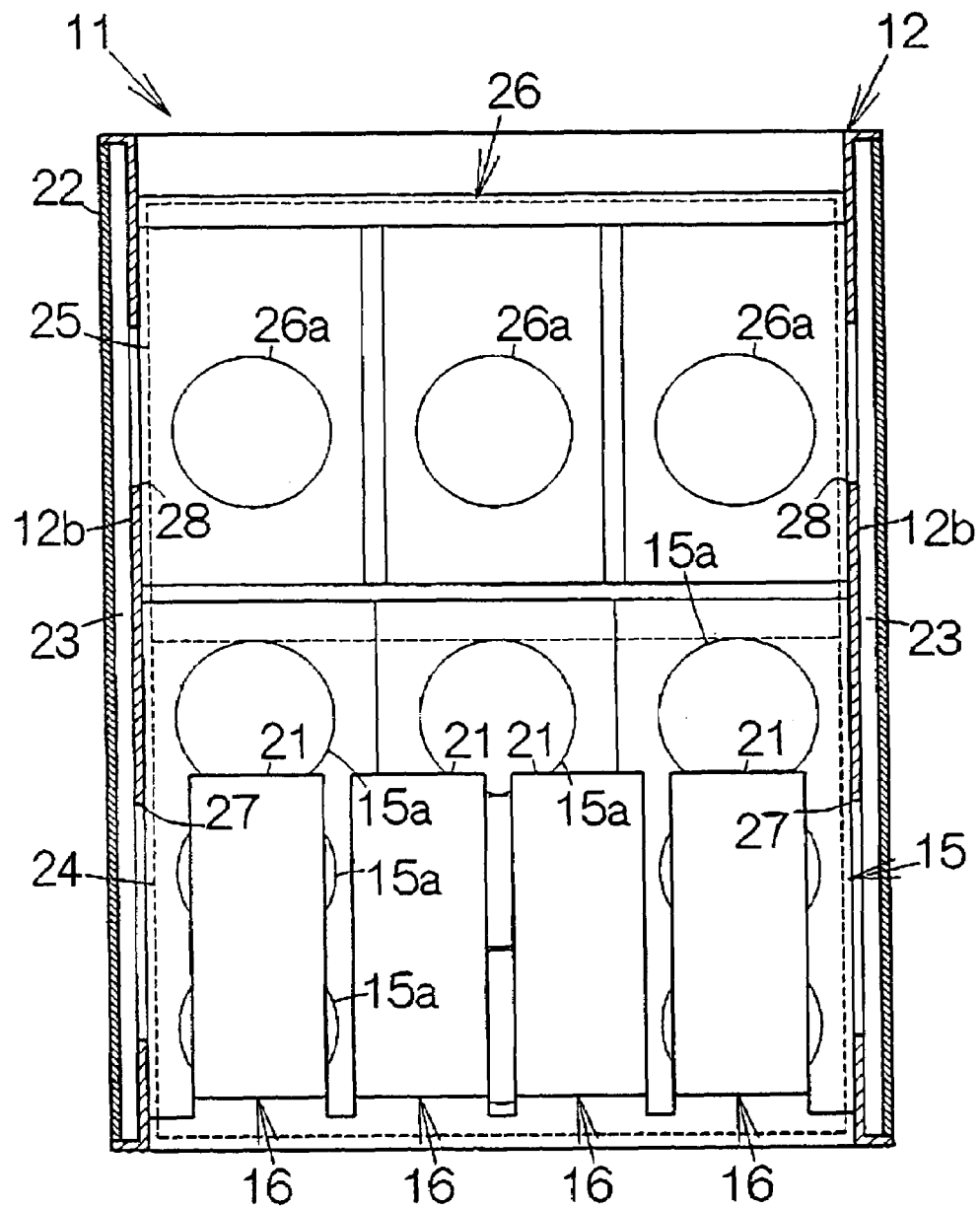
FIG. 2 is a sectional view taken along the line 2-2 in FIG. 1.

An outer panel, namely an exterior or dressing panel 22, is attached to each side of the enclosure 12. FIG. 2 is a sectional view taken along the line 2-2 in FIG. 1. The downside of FIG. 2 corresponds to the front of the server computer 11. Referring also to FIG. 2, the enclosure 12 includes panels 12b at the sides of the enclosure 12, namely side panels 12b, extending in the vertical direction inside the exterior panel 22. The exterior panel 22 is fitted into the corresponding side panel 12b. The side panel 12b is opposed to the exterior panel 22 at a predetermined interval. A space 23 in the form of a flat parallelepiped is in this manner defined between the exterior panel 22 and the side panel 12b outside the enclosure 12, for example.

A first section or first space 24 and a second section or second space 25 are defined inside the enclosure 12. The first space 24 is defined at the foreside of the enclosure 12. The second space 25 is defined at the backside of the enclosure 12. The first and second spaces 24, 25 are located adjacent to each other. The first space 24 is defined between the top panel 12a and the fan units 15 at a position downstream of the axial flow fans 15a of the fan units 15. The power source unit sets 16 are placed in the first space 24. Likewise, the second space 25 is defined between the top panel 12a and fan units 26 at a position downstream of axial flow fans 26a of the fan units 26. The fan units 26 are placed within the enclosure 12 at the backside of the enclosure 12. The fan units 15, 26 may be placed at the same level above the floor.

Figure 3:
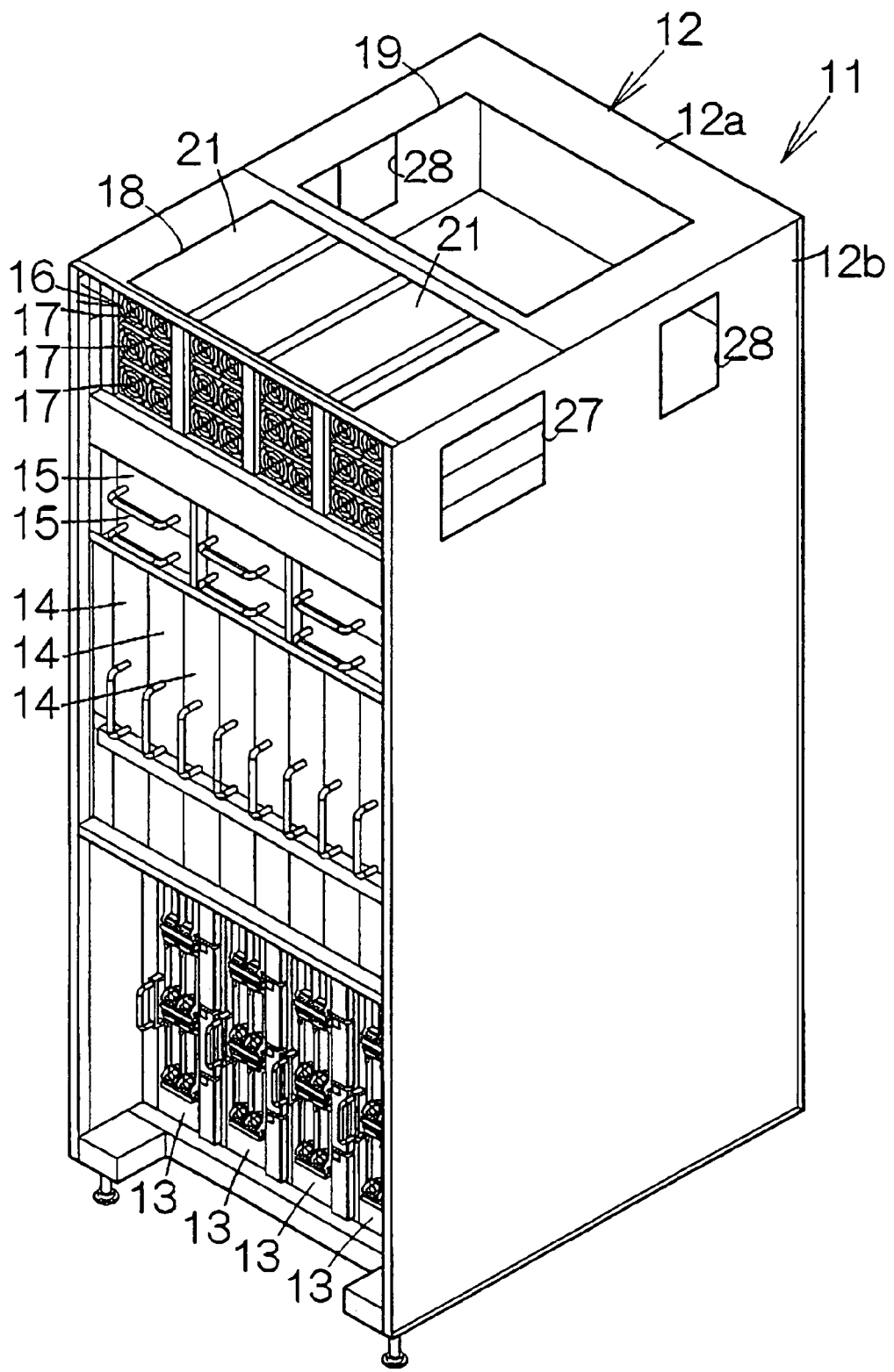
FIG. 3 is a perspective view schematically illustrating the server computer without an exterior panel.

First and second air vents 27, 28 are formed in the individual side panel 12b. The first air vent 27 serves to connect the space 23 to the first space 24. The second air vent 28 serves to connect the space 23 to the second space 25. FIG. 3 schematically illustrates the server computer 11 without the exterior panel 22. Referring also to FIG. 3, the first air vent 27 is formed at a position corresponding to the position of the power source units 17 in the enclosure 12. The first air vent 27 is opposed to the side of the duct 21 of the power source unit 17 closest to the side panel 12b, for example. The second air vent 28 is formed at a position corresponding to the position of the second space 25. Here, the first and second air vents 27, 28 may be placed at the same level above the floor. The first and second air vents 27, 28 may be equal in size.

Figure 4:
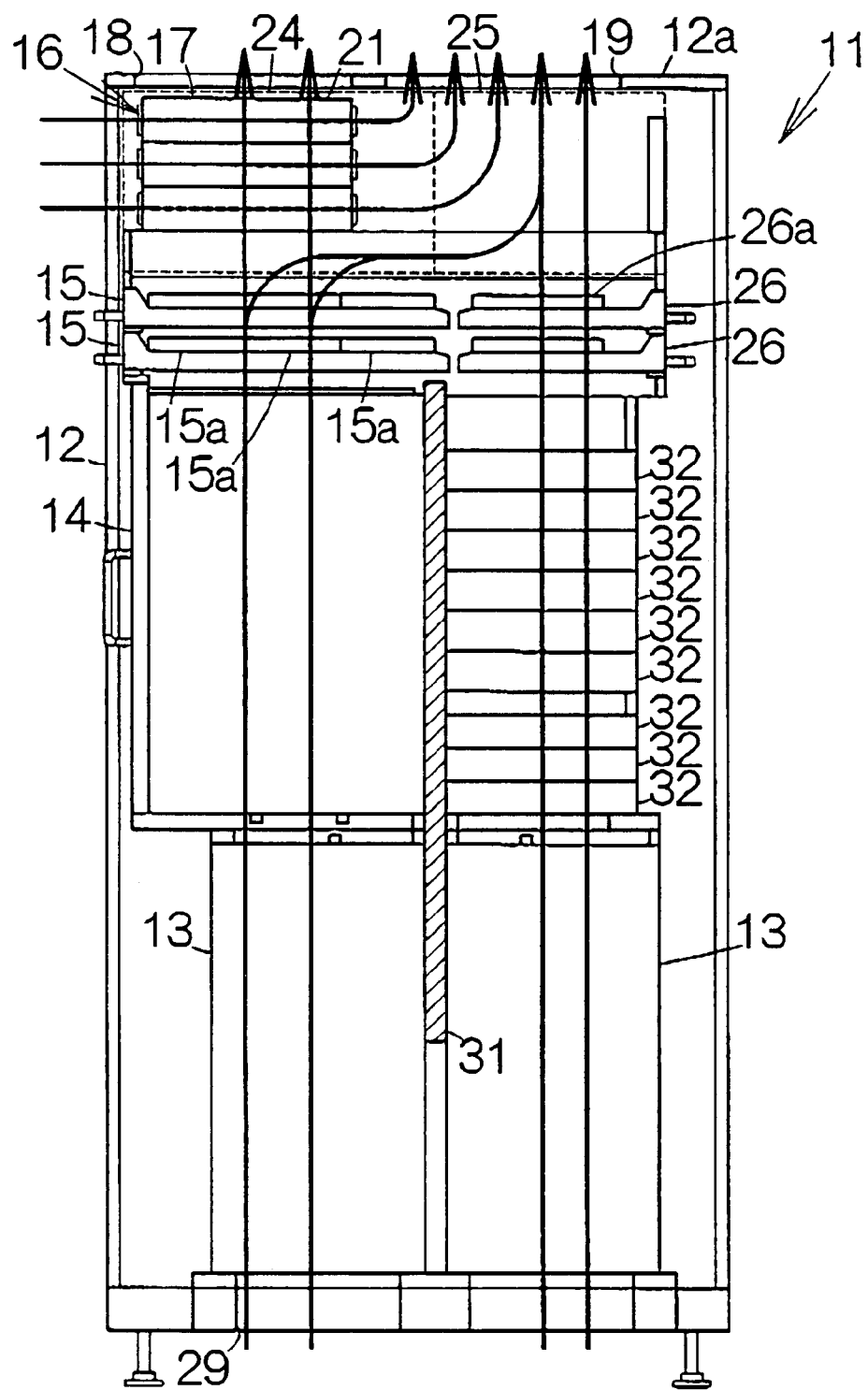
FIG. 4 is a sectional view of the server computer for schematically illustrating air passages.

FIG. 4 is a vertical sectional view of the server computer 11. The arrows stand for airflow in FIG. 4. As shown in FIG. 4, an air intake opening 29 is formed in the bottom of the enclosure 12. The air intake opening 29 is opposed to the floor. A fresh air is introduced into the inner space of the enclosure 12 through the air intake opening 29. A back panel 31 is placed in the inner space of the enclosure 12. The back panel 31 stands upright in the vertical direction. The system board units 14 and the input/output units 13 are coupled to the front surface of the back panel 31. The electronic component units 32 and the input/output units 13 is coupled to the back surface of the back panel 31.

The individual electronic component unit 32 includes an interface unit controlling the interface of the server computer 11 and a controller unit controlling the processing of the server computer 11, for example. The electronic component unit 32 includes a printed wiring board extending in the horizontal direction. Here, a predetermined interval may be defined between the electronic component units 32 and the inward surface of the side panel 12b.

The fan units 15 serve to generate airflow running in the vertical direction from the air intake opening 29. The PCI boards of the input/output units 13 and the system boards of the system board units 14 stand upright in the vertical direction. The airflow thus runs in the vertical direction through the input/output units 13 and the system board units 14. The airflow absorbs heat from the PCI boards and the electronic circuit elements in the system board units 14. The PCI boards and the electronic circuit elements are thus prevented from a rise in temperature. The airflow then enters gaps between the power source unit sets 16.

Figure 5:
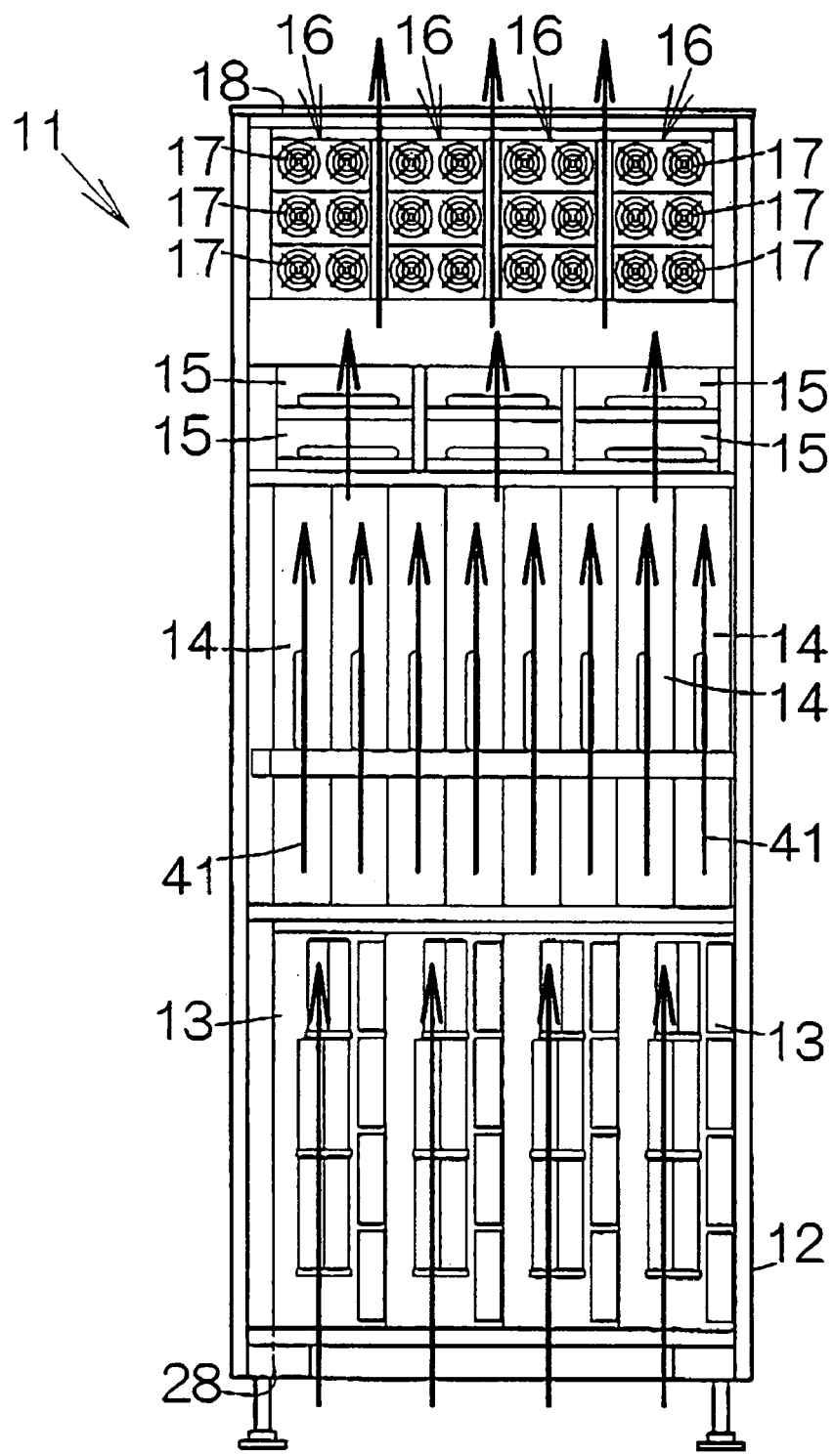
FIG. 5 is a front view of the server computer for schematically illustrating the air passages.

FIG. 5 is a front view of the server computer 11. The arrows stand for airflow in FIG. 5. Referring also to FIG. 5, the airflow runs in the vertical direction between the power source unit sets 16. The airflow is then discharged outside through the first air discharge opening 18.

As shown in FIG. 4, the airflow collides against the bottoms of the power source units 17 in the first space 24. This causes a change in the direction of part of the airflow. Such airflow runs in the horizontal direction between the ducts 21 and the fan units 15 from the first space 24 toward the second space 25. The airflow is then discharged outside through the second air discharge opening 19.

The fans placed within the ducts 21 allow airflow running in the horizontal direction through the power source units 17 from the front ends of the power source units 17 toward the rear ends of the power source units 17. The airflow absorbs heat from the power source units 17. The power source units 17 are thus prevented from a rise in temperature. The airflow runs from the rear ends of the ducts 21 toward the second space 25. The airflow is then discharged outside through the second air discharge opening 19.

The axial flow fans 26a of the fan units 26 generate airflow running in the vertical direction from the air intake opening 29 in the same manner as the axial flow fans 15a of the fan units 15. The printed wiring boards of the input/output units 13 stand upright in the vertical direction. The airflow thus runs in the vertical direction through the input/output units 13. The airflow absorbs heat from the electronic circuit elements on the input/output units 13. The electronic circuit elements are prevented from a rise in temperature.

The airflow then runs in the vertical direction between the electronic component units 32 and the side panels 12b. Part of the airflow runs in the horizontal direction along the printed wiring boards of the electronic component units 32. The airflow thus absorbs heat from the electronic circuit elements on the electronic component units 32. The electronic circuit elements are prevented from a rise in temperature. The airflow is then discharged outside through the second air discharge opening 19.

The ducts 21 inevitably serve to block airflow in the first space 24. This causes a change in the direction of the airflow. The pressure loss thus increases in the first space 24. The airflow from the fan units 15 causes an increase in the pressure of the first space 24. On the contrary, the airflow is smoothly discharged outside through the second air discharge opening 19 in the second space 25. There is no increase in the pressure of the second space 25. The pressure of the first space 24 thus gets larger than that of the second space 25.

Figure 6:
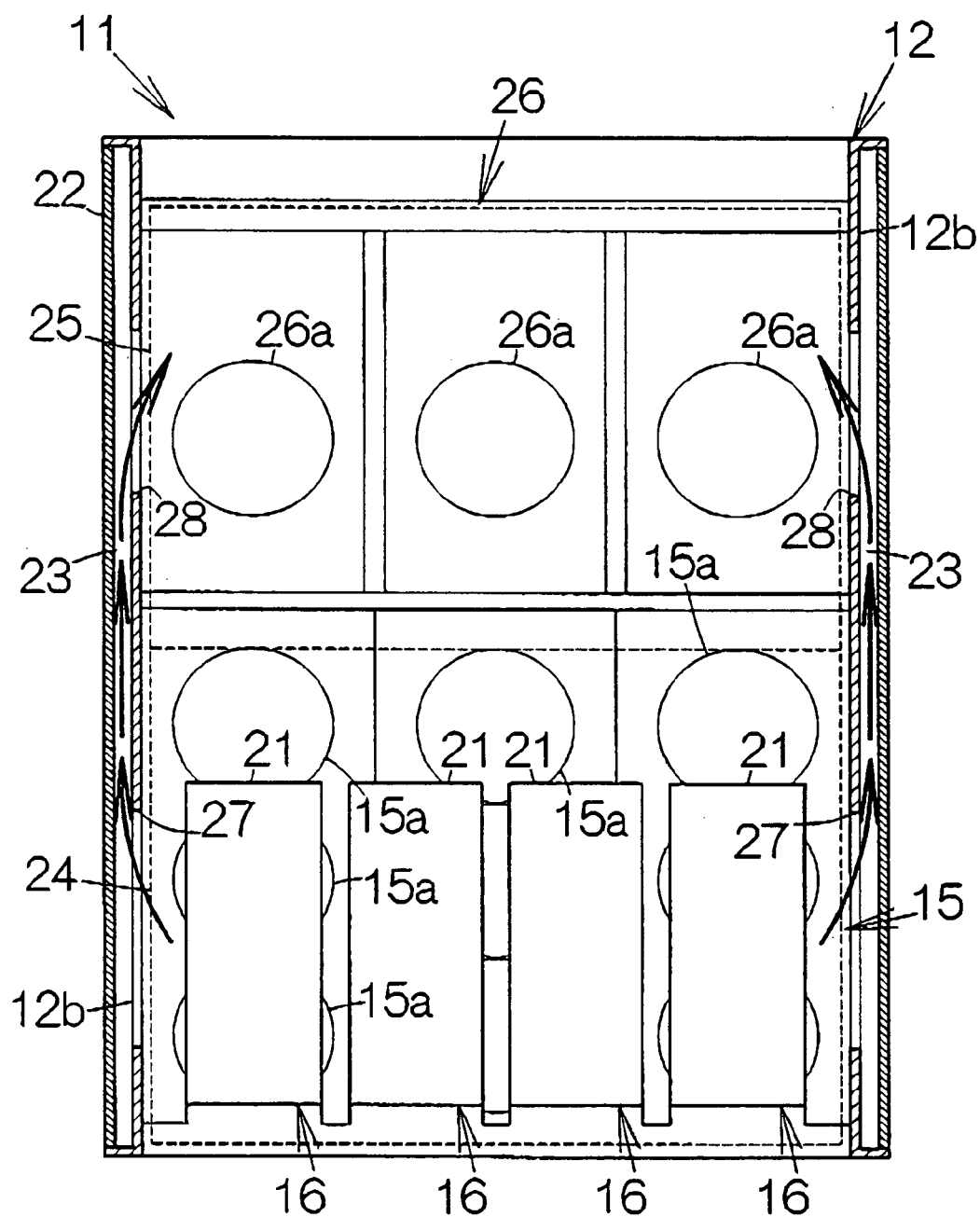
FIG. 6 is a sectional view, corresponding to FIG. 2, for schematically illustrating airflow moving from a first space into a second space.

The larger pressure of the first space 24 causes the airflow in the first space 24 to move out of the enclosure 12 into the spaces 23 through the first air vents 27, as shown in FIG. 6. The airflow then moves into the second space 25 through the second air vents 28. The spaces 23 serve as air passages connecting the first space 24 and the second space 25 in this manner. The airflow is then discharged outside through the second air discharge opening 19.

Since the pressure of the first space 24 is set larger than that of the second space 25 in the server computer 11, the airflow smoothly moves out of the first space 24 into the second space 25 through the spaces 23. The amount of the airflow increases in the first space 24. The airflow blocked within the first space 24 can easily move into the second space 25. The airflow is allowed to smoothly run in the first space 24. The PCI boards 24 and the electronic circuit elements in the first space 24 can thus sufficiently be cooled. The narrow gaps between the side panels 12b of the enclosure 12 and the exterior panels 22 are utilized as the spaces 23. The enclosure 12 is not required to make room for establishment of air passages. The enclosure 12 can surely be prevented from getting larger. In addition, it is not necessary to enhance the performance of the fan units 15, 26. The fan units 15, 26 may not be replaced with ones having a higher performance. The server computer 11 is thus prevented from suffering from an increase in the production cost.

What is claimed is:

1. An electronic apparatus comprising:
   an enclosure including a panel, said enclosure defining first and second sections therein;
   an outer panel coupled to an outer surface of the panel, said outer panel and the panel in combination defining a third section therebetween;
   a first air vent formed in the panel at a position corresponding to position of the first section, said first air vent connecting the first section to the third section;
   a second air vent formed in the panel at a position corresponding to position of the second section, said second air vent connecting the second section to the third section; and
   a fan placed within the enclosure, said fan generating airflow running at least in the first section, wherein the airflow running from the first air vent to the second air vent through the third section.

2. The electronic apparatus according to claim 1, wherein the first section is located in front of the second section.

* * * * *